United States Patent [19]

Pankove

[11] 4,254,426

[45] Mar. 3, 1981

[54] METHOD AND STRUCTURE FOR PASSIVATING SEMICONDUCTOR MATERIAL

[75] Inventor: Jacques I. Pankove, Princeton, N.J.

[73] Assignee: RCA Corporation, New York, N.Y.

[21] Appl. No.: 37,379

[22] Filed: May 9, 1979

[51] Int. Cl.³ .............................................. H01L 45/00
[52] U.S. Cl. .......................................... 357/2; 357/16; 427/86
[58] Field of Search .................... 357/2, 4, 16; 427/86

[56] References Cited

U.S. PATENT DOCUMENTS

| 4,064,521 | 12/1977 | Carlson ........................................ 357/2 |
| 4,142,195 | 2/1979 | Carlson et al. ........................... 357/15 |
| 4,162,505 | 7/1979 | Hanak .......................................... 357/30 |
| 4,166,919 | 9/1979 | Carlson ..................................... 136/89 |

OTHER PUBLICATIONS

Brodsky et al., *I.B.M. Tech. Discl. Bull.*, vol. 20, No. 11B, Apr. 1978, pp. 4962–4963.

*Primary Examiner*—Martin H. Edlow
*Attorney, Agent, or Firm*—Birgit E. Morris; Donald S. Cohen; Thomas H. Magee

[57] ABSTRACT

A structure for passivating semiconductor material comprises a substrate of crystalline semiconductor material, a relatively thin film of carbon disposed on a surface of the crystalline material, and a layer of hydrogenated amorphous silicon deposited on the carbon film.

11 Claims, 3 Drawing Figures

METHOD AND STRUCTURE FOR PASSIVATING SEMICONDUCTOR MATERIAL

The Government of the United States of America has rights in this invention pursuant to Dept. of Energy Contract No. EY-76-C-03-1286.

This invention relates to a method and structure for passivating a semiconductor material in order to reduce the undesirable effects of recombination/generation centers in the semiconductor material.

The operating performance of a semiconductor device having active components disposed therein is frequently degraded by the removal of charge carriers needed for the operation of the device, and by the generation of unwanted charge carriers, thereby increasing power dissipation and noise. From the early history of germanium and silicon single-crystal semiconductor physics, it is known that such semiconductor material contains dangling bonds which are potent minority-carrier lifetime killers. These dangling bonds are responsible for states in the energy gap which, depending on the applied bias, either remove the charge carriers needed for the operation of the device or generate unwanted charge carriers. Dangling bonds occur primarily at the surface of the device and are responsible for the so-called "surface recombination". Dangling bonds also occur at vacancies, micropores, dislocations, and are associated with certain impurities.

It is known that the formation of amorphous silicon (a-Si) by the glow-discharge decomposition of silane results in a hydrogen-rich material. A method of depositing a body of amorphous silicon on a substrate in a glow-discharge apparatus is described in U.S. Pat. No. 4,064,521, which issued to D. E. Carlson on Dec. 20, 1977 and is assigned to RCA Corporation. It has been shown by J. I. Pankove and D. E. Carlson in Appl. Phys. Letters 31, (1977), 450 that a-Si produced by the glow-discharge decomposition of silane may contain approximately 18 to 50 atomic percent of hyrdrogen. Most of this hydrogen is believed to be valence-bonded to silicon atoms in the amorphous network as Si-H bonds. Heating the H-doped a-Si in vacuum causes a measureable evolution of hydrogen. When a-Si:H is thermally dehydrogenated, the residue is in the form of Si which is extremely rich in dangling bonds. The dangling bonds left in the material by the outgassing of hydrogen are effective sites for non-radiative recombination, as they are in single-crystal Si.

M. L. Tarng and I have reported a technique for passivating a PN junction adjacent a surface of a semiconductor substrate comprising coating the area of the surface adjacent the PN junction with a layer of hydrogenated amorphous silicon (a-Si:H) containing between about 5 and 50 atomic percent of hydrogen. Such a layer may be produced by the glow discharge dissociation of silane (SiH$_4$). However, upon heating such a layer of a-Si:H, a serious problem is encountered with the poor adhesion of the hydrogenated amorphous silicon to the crystalline silicon, c-Si. When the combination of a-Si:H deposited upon c-Si is heated to temperatures of 350° C. or higher, blisters develop in the a-Si:H layer causing its detachment from the c-Si substrate. Eventually, the blisters break and the a-Si:H flakes away.

The present invention provides a technique for improving the adhesion of a deposited hydrogenated amorphous silicon layer, thereby allowing the a-Si:H layer to passivate the underlying semiconductor material by reducing the number of recombination/generation centers in the material. This technique provides for an adherent passivant which withstands heating up to 600° C.

Figure 1:
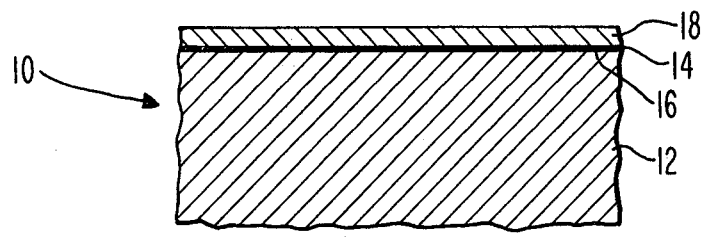
FIG. 1 is a partial cross-sectional view of a portion of a silicon wafer illustrating the novel structure of the present invention.

Referring to FIG. 1 of the drawings, there is shown a structure 10 incorporating the novel passivating technique of the present invention. The structure 10 comprises a crystalline semiconductor substrate 12 having a film 14 containing carbon atoms disposed on a surface 16 thereof. The crystalline substrate may comprise a portion of a silicon wafer having one or more active components (not shown) disposed therein. The film 14 is relatively thin, having a thickness less than about 1,000 Å when deposited. This film subsequently becomes thinner during the deposition of the hydrogenated amorphous silicon layer, as further described below. In the present embodiment, the film 14 comprises a thin film of amorphous carbon. However, the film 14 may also comprise any carbon-containing compound such as a film of hydrogenated carbon having the formula CH$_x$. Such a film of hydrogenated carbon can be formed by decomposing a hydrocarbon, such as ethane (C$_2$H$_6$), utilizing a glow discharge. A layer 18 of hydrogenated amorphous silicon containing between about 5 and about 50 atomic percent of hydrogen is then formed as a coating over the thin carbon-containing film 14, as shown in FIG. 1.

In the present embodiment, the carbon-containing film 14 is deposited by utilizing a carbon arc at a pressure below atmospheric pressure to evaporate carbon atoms onto the surface 16. Such a technique is known in the art and is used in a vacuum chamber for coating scanning electron microscopic (SEM) specimens with a thin conducting layer. Other techniques may be utilized to deposit the carbon-containing film 14, including decomposing a hydrocarbon utilizing a glow discharge. The thickness of the deposited film 14 is preferably about 300 Å. If the film 14 is too thick, it will have a tendency to peel off; if it is too thin, it will have little effect in improving the adhesion of the subsequently deposited a-Si:H layer 18.

The a-Si:H layer 18 is preferably deposited in accordance with a technique previously reported by M. L. Tarng and myself. In this technique, silane (SiH$_4$) is decomposed in a vacuum chamber at a pressure of about 0.5 Torr while heating the substrate to a temperature of approximately 350° C. The silane is subjected to a glow discharge induced by a capacitively-coupled rf system. Once the glow discharge is initiated, the discharge both ionizes and dissociates the SiH$_4$ molecules. The positive silicon ions and the positive silicon hydride ions, such as SiH$^{+1}$, SiH$_2{}^{+2}$, and SiH$_3{}^{+3}$, deposit adjacent to the surface of the carbon-containing film 14, forming a layer 18 of hydrogenated amorphous silicon. Preferably, the thickness of the deposited a-Si:H ranges from 0.1 $\mu$m to about 1 $\mu$m. The a-Si:H layer 18 may also be deposited by sputtering silicon in the presence of hydrogen, or by pyrolysis of silane at a low temperature (<450° C.).

I have discovered that the carbon-containing film 14 allows the subsequently deposited a-Si:H layer 18 to adhere tenaciously to the c-Si substrate 12. Although the exact adhesion-improving mechanism is not fully understood at this time, it is believed that the carbon atoms promote good bonds with both the crystalline substrate 12 and the amorphous silicon layer 18, possibly via a discharge-activated formation of SiC. The improved structure 10 is able to be heated to 600° C. while maintaining the mechanical stability of the a-Si:H layer 18, i.e., no noticeable blistering or flaking is observed. It is emphasized that the carbon-containing film 14 as deposited must be relatively thin, preferably about 300 Å in thickness; if too thick, the layer 14 will form an undesirable continuous conducting film. Although some interfacial carbon (between the substrate and a-Si:H layer 18) is detectable by means of secondary ion mass spectrometry (SIMS), some of the carbon disappears during the deposition of the a-Si:H layer 18, possibly by reacting with atomic hydrogen generated by the glow discharge in silane.

Figures 2, 3:
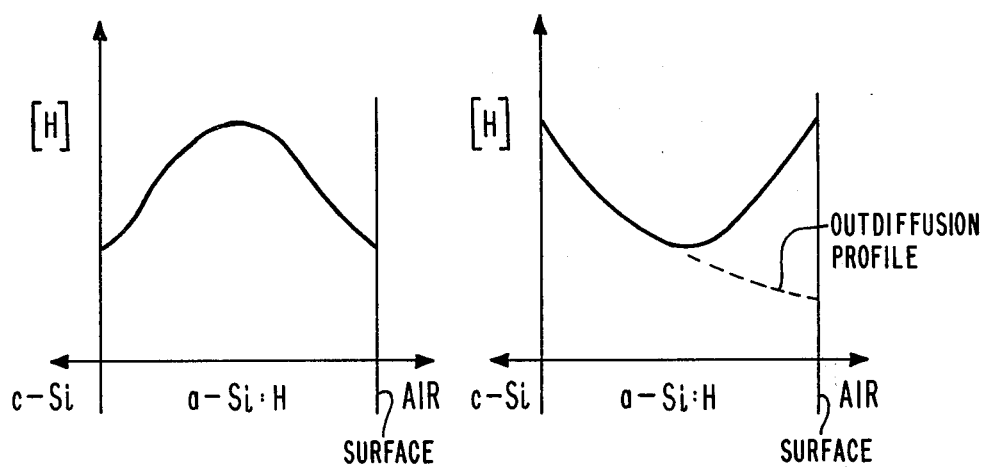
FIGS. 2 and 3 are diagrams illustrating the hydrogen concentration as a function of depth in differently structured hydrogenated amorphous silicon layers able to be manufactured utilizing the technique of the present invention.

One of the advantages of the present novel structure is that it permits the formation of different hydrogen concentration profiles across the thickness of the layer 18 of hydrogenated amorphous silicon. The present structure allows the formation of a hydrogen concentration profile having a maximum value in substantially the central region of the a-Si:H layer 18, as illustrated in FIG. 2 of the drawings. It is also possible to form a profile wherein the hydrogen concentration has a minimum value in the central region of the a-Si:H layer 18, as illustrated in FIG. 3. By heating the structure 10 in a vacuum to a temperature greater than 350° C., the resulting out-diffusion of hydrogen produces a concentration gradient of hydrogen increasing toward the a-c (amorphous-crystalline) interface. A concentration gradient of hydrogen increasing toward the outer surface of the a-Si:H layer 18 is produced by exposing the layer 18 to atomic hydrogen at a temperature lower than about 400° C. Consequently, by combining out diffusion and in-diffusion treatments, it is possible to establish a hydrogen profile which forms a maximum or minimum inside the amorphous silicon layer 18. Such profiles may be beneficial in further improving the operating performance of active semiconductor components in integrated circuit devices.

The present invention improves the adhesion of a deposited a-Si:H layer, thereby providing for an adherent passivating layer which is capable of withstanding temperatures up to 600° C. The present invention is applicable not only in providing an adherent passivant for an underlying crystalline substrate, but also in providing an ultraclean substrate layer for the fabrication of amorphous silicon devices.

What is claimed is:

1. In a method of passivating semiconductor material wherein a surface of a crystalline semiconductor substrate is coated with a layer of hydrogenated amorphous silicon, the improvement comprising depositing a film containing carbon atoms onto said surface prior to performing said coating step.

2. A method as recited in claim 1 wherein said film comprises a thin film of amorphous carbon.

3. A method as recited in claim 2 wherein said depositing step is performed by utilizing a carbon arc at a pressure below atmospheric pressure to evaporate carbon atoms onto said surface.

4. A method as recited in claim 1 wherein said film comprises a film of hydrogenated carbon having the formula $CH_x$.

5. A method as recited in claim 4 wherein said depositing step is performed by decomposing a hydrocarbon utilizing a glow discharge.

6. A method as recited in claim 1 wherein said film comprises a thin film of graphite.

7. A method as recited in claim 1 wherein said semiconductor substrate is silicon and wherein the thickness of said film is less than about 1,000 Å.

8. In a semiconductor structure having a layer of hydrogenated amorphous silicon adjacent a surface of a crystalline semiconductor substrate, the improvement comprising a film containing carbon atoms disposed on said surface between said substrate and said layer of hydrogenated amorphous silicon.

9. A semiconductor structure as defined in claim 8 wherein said semiconductor substrate is silicon and wherein said film comprises a thin film of amorphous carbon having a thickness less than about 1,000 Å.

10. A semiconductor structure as defined in claim 8 wherein the hydrogen concentration profile across said layer of hydrogenated amorphous silicon has a maximum value in substantially the central region of said hydrogenated amorphous silicon layer.

11. A semiconductor structure as defined in claim 8 wherein the hydrogen concentration profile across said layer of hydrogenated amorphous silicon has a minimum value in substantially the central region of said hydrogenated amorphous silicon layer.

* * * * *